United States Patent
Nam et al.

(10) Patent No.: US 7,632,746 B2
(45) Date of Patent: Dec. 15, 2009

(54) METHOD FOR PATTERNING METAL LINE IN SEMICONDUCTOR DEVICE

(75) Inventors: Ki-Won Nam, Kyoungki-do (KR); Seung-Bum Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 373 days.

(21) Appl. No.: 11/641,295

(22) Filed: Dec. 18, 2006

(65) Prior Publication Data

US 2008/0003813 A1    Jan. 3, 2008

(30) Foreign Application Priority Data

Jun. 30, 2006    (KR) ...................... 10-2006-0061444

(51) Int. Cl.
H01L 21/00    (2006.01)
(52) U.S. Cl. .................. 438/592; 438/652; 438/199
(58) Field of Classification Search ............. 438/592, 438/652, 199
See application file for complete search history.

(56) References Cited

U.S. PATENT DOCUMENTS

| 5,407,698 A * | 4/1995 | Emesh ................ 438/199 |
| 2001/0005622 A1* | 6/2001 | Kim et al. .............. 438/592 |
| 2008/0003813 A1* | 1/2008 | Nam et al. ............. 438/652 |

FOREIGN PATENT DOCUMENTS

| JP | 04-245625 | 9/1992 |
| KR | 10-2005-0015116 | 2/2005 |
| KR | 1020060038611 A | 5/2006 |

* cited by examiner

Primary Examiner—Laura M Menz
(74) Attorney, Agent, or Firm—Blakely, Sokoloff, Taylor & Zafman LLP

(57) ABSTRACT

A method for patterning a metal line includes forming a barrier metal layer and a metal layer, etching the metal layer, etching the barrier metal layer to form a passivation layer on an etched surface of the barrier metal layer, and cleaning a resultant structure where the passivation layer is formed.

6 Claims, 3 Drawing Sheets

US 7,632,746 B2

METHOD FOR PATTERNING METAL LINE IN SEMICONDUCTOR DEVICE

CROSS-REFERENCE TO RELATED APPLICATIONS

The present invention claims priority of Korean patent application number 10-2006-0061444, filed on Jun. 30, 2006, which is incorporated by reference in its entirety.

BACKGROUND OF THE INVENTION

The present invention relates to a method for manufacturing a semiconductor device, and more particularly, to a method for patterning a metal line with a titanium/titanium nitride (Ti/TiN) barrier metal layer.

In recent years, with the integration of bit lines, a single or multiple layers formed of Ti and/or TiN is typically used as a barrier metal layer for the bit line. When, however, employing the Ti/TiN as the barrier metal, there exists a limitation that a portion of the barrier metal layer is lost, and resultantly the bit line collapses, while performing a cleaning process after etching a tungsten layer and the barrier metal layer.

FIGS. 1A and 1B are cross-sectional views illustrating a typical method for patterning a bit line. Referring to FIG. 1A, a barrier metal layer, a tungsten layer and a hard mask nitride layer are sequentially formed over an oxide layer 11 which has undergone predetermined processes. Then, an etching process is performed using a bit line mask to thereby form a bit line pattern configured with a barrier metal pattern 12, a tungsten pattern 13 and a hard mask nitride pattern 14. Thereafter, referring to FIG. 1B, a cleaning process is performed for removing by-products produced in the etching process.

Meanwhile, prior to the cleaning process after the dry etching process, the structure with the bit line pattern formed is inevitably exposed to an ambient atmosphere for a predetermined duration. Accordingly, the Ti/TiN barrier metal pattern 12 exposed to the ambient atmosphere reacts with oxygen contained in the atmosphere so that side surfaces of the barrier metal pattern 12 are oxidized. This oxidized portion 15 of the barrier metal pattern 12 is removed during a subsequent cleaning process, which causes a thickness loss of the barrier metal pattern 12. Moreover, the thickness loss of the barrier metal pattern 12 weakens the bearing power at the lower part of the bit line pattern, i.e., at the barrier metal pattern 12. After all, the bit line pattern may collapse. Unfortunately, the pattern collapse phenomenon is not limited to the patterning process of the bit line but also occurs during a patterning process of a metal line using Ti/TiN as a barrier metal.

SUMMARY OF THE INVENTION

Embodiments of the present invention are directed to provide a method for patterning a metal line capable of preventing a pattern collapse phenomenon during a cleaning process due to an oxidation of a side surface of a Ti/TiN barrier metal layer.

In accordance with an aspect of the present invention, there is provided method for patterning a metal line, including: forming a barrier metal layer and a metal layer; etching the metal layer; etching the barrier metal layer to form a passivation layer on an etched surface of the barrier metal layer; and cleaning a resultant structure where the passivation layer is formed.

DESCRIPTION OF SPECIFIC EMBODIMENTS

Figure 1A:
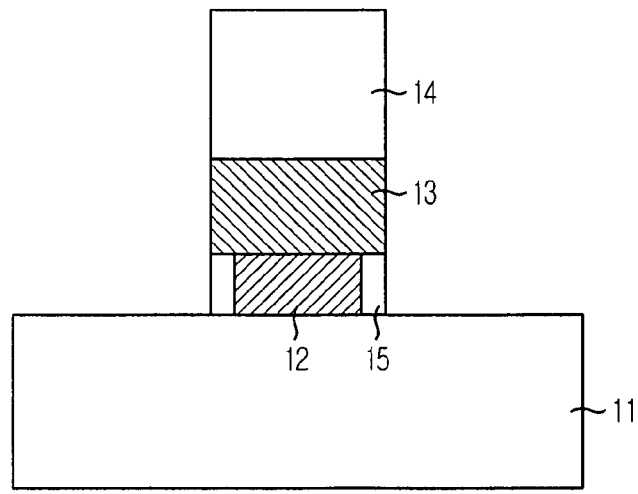
FIGS. 1A and 1B illustrate cross-sectional views of a typical method for patterning a metal line.
Figure 1B:
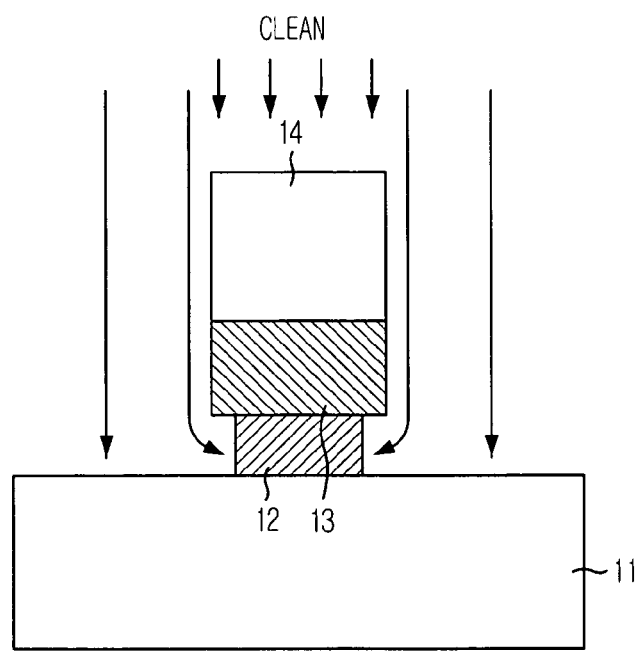
Figure 2A:
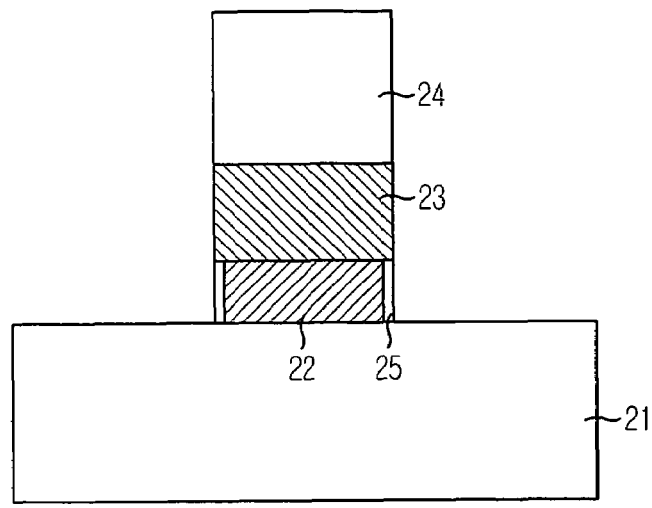
FIGS. 2A and 2B illustrate cross-sectional views of a method for patterning a metal line in accordance with a specific embodiment of the present invention.
Figure 2B:
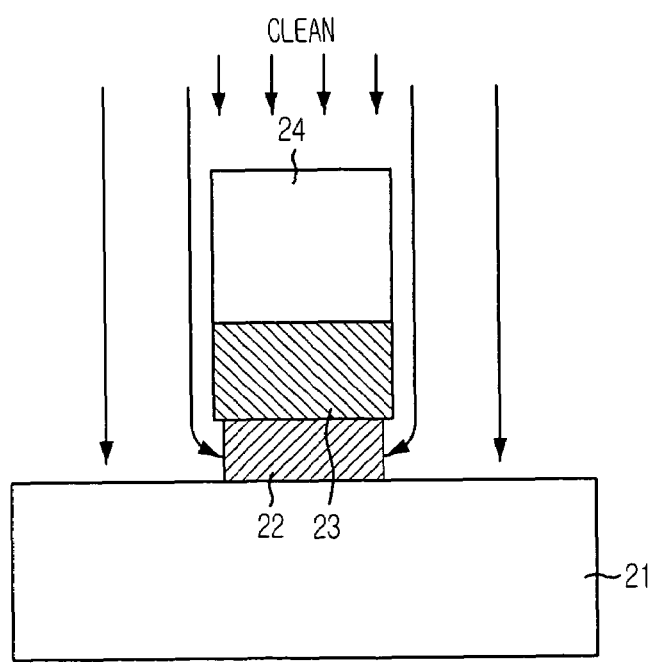

FIGS. 2A and 2B are cross-sectional views illustrating a method for patterning a metal line in accordance with a specific embodiment of the present invention.

Referring to FIG. 2A, a barrier metal layer formed of titanium (Ti)/titanium nitride (TiN) (hereinafter, referred to as Ti/TiN barrier metal layer), a tungsten layer and a hard mask nitride layer are sequentially formed over an oxide layer 21 which has undergone predetermined processes. Then, the hard mask layer is dry-etched using a bit line mask to form a hard mask nitride pattern 24. Afterward, the tungsten layer and the Ti/TiN barrier metal layer are etched using the hard mask nitride pattern 24 as an etch mask. Hence, a bit line pattern is formed, which is configured with a barrier metal pattern 22 formed of Ti/TiN (hereinafter, referred to as Ti/TiN barrier metal), a tungsten pattern 23, and a hard mask nitride pattern 24. Here, the Ti/TiN barrier metal pattern 22 has a structure that Ti and TiN patterns are sequentially stacked over the oxide layer 21.

The tungsten layer is etched using an etchant selected from a group consisting of sulfur hexafluoride ($SF_6$) gas, nitrogen ($N_2$) gas and combination thereof. The barrier metal layer of Ti/TiN is etched using a mixed gas of fluorine based gas and chlorine based gas with argon gas added. While titanium and titanium nitride in the Ti/TiN barrier metal layer 22 is transformed to TiFx by fluorine, and the fluorine is substituted by chlorine so as to form TiClx, the Ti/TiN barrier metal layer 22 is etched by virtue of the Ar-sputtering effect. The temperature of a wafer chuck on which a wafer is placed is set approximately 100° C. or higher so that a passivation layer 25 is formed on an etched side surface of the Ti/TiN barrier metal 22.

Accordingly, the Ti/TiN barrier metal layer is etched using a mixed gas of a fluorine based gas and a chlorine based gas added with argon gas on condition that the temperature of the wafer chuck is set at least approximately 100° C. or higher. Here, it is preferable that the temperature of the wafer chuck range from approximately 100° C. to approximately 350° C. If the temperature is higher than 350° C., the tungsten layer may be oxidized. Therefore the temperature of the wafer chuck must be set approximately 350° C. or lower. For reference, the temperature of the wafer chuck has been set to a room temperature in the typical method.

The passivation layer 25 formed on an etched side surface of the Ti/TiN barrier metal 22 plays a role in preventing the titanium and the titanium nitride of the etched surface from reacting with oxygen even though the surface is exposed to an ambient atmosphere prior to a following cleaning process. In order to etch the Ti/TiN barrier metal layer such that that the passivation layer 25 is formed on the etched side surfaces thereof, it is preferable that the etching process be performed on condition that the temperature of the wafer chuck is set to range from approximately 100° C. to approximately 350° C., the fluorine based gas is at least one gas selected from a group consisting of $SF_6$, nitrogen trifluoride ($NF_3$) and tetrafluoromethane ($CF_4$), and the chlorine based gas is at least one gas selected from a group consisting of $Cl_2$ and $BCl_3$. Further, the argon gas is added to the mixed gas of the fluorine based gas and the chlorine based gas for increasing an etch rate by virtue of a sputtering effect. It is preferable that a total flow rate of the mixed gas ranges from approximately 100 sccm to approximately 300 sccm, a flow rate ratio of the fluorine based gas to the chlorine based gas is approximately 1:1, and a flow rate of the argon gas added to the mixed gas ranges from approximately 10% to approximately 30% of the total flow rate, i.e., from approximately 100 sccm to approximately 300 sccm, of the mixed gas.

Referring to FIG. 2B, a cleaning process is performed for removing by-products formed in the etching process. Before the cleaning process, the bit line pattern is inevitably exposed to an ambient atmosphere. In accordance with the present invention, however, the passivation layer 25 is formed on the etched surface of the Ti/TiN barrier-metal 22 so that it is possible to minimize the oxidation of the Ti/TiN barrier metal. That is, the passivation layer 25 reduces a thickness of a portion containing oxygen of the Ti/TiN barrier metal 22. Therefore, a thickness of the oxidized portion of the Ti/TiN barrier metal 22 can be minimized so that the loss at the side surface of the Ti/TiN barrier metal 22 can be minimized despite the cleaning process. During the cleaning process, the passivation layer 25 is also removed.

Figure 3:
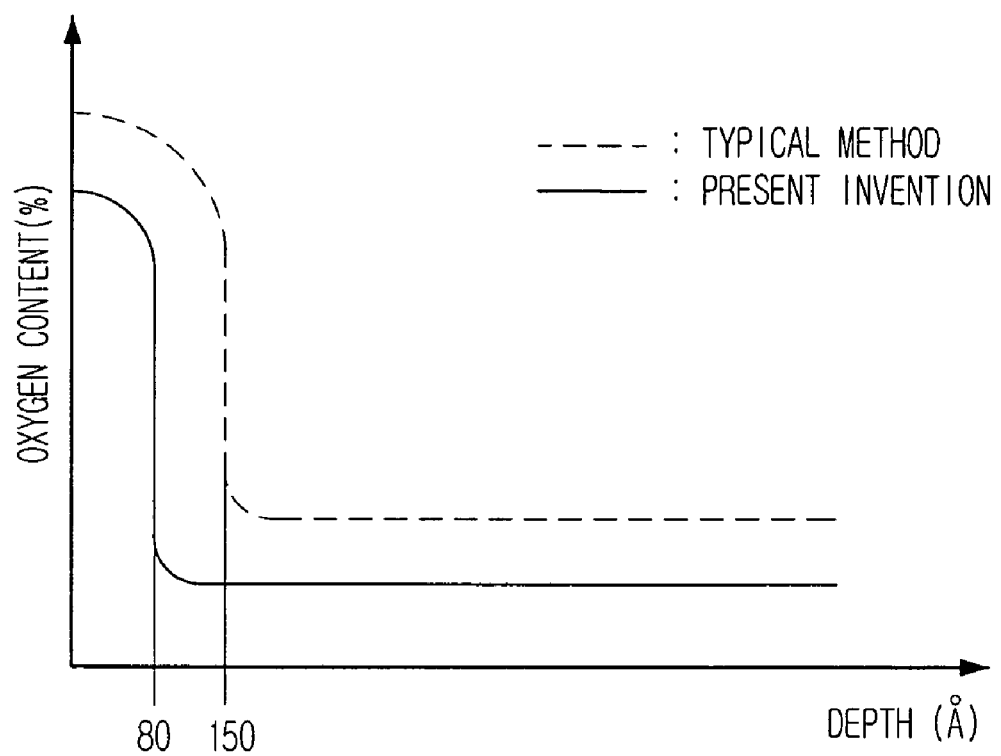
FIG. 3 illustrates a graph of oxygen content in a barrier metal versus a depth thereof detected by auger electron spectroscopy (AES) analysis.

FIG. 3 illustrates a graph of oxygen content in a barrier metal versus a depth thereof detected by auger electron spectroscopy (AES) analysis. The solid line illustrated in FIG. 3 shows that the penetration depth of oxygen into the Ti/TiN barrier metal after the lapse of a predetermined exposure time is approximately 80 Å in accordance with the present invention, whereas as the dotted line shows that the penetration depth of oxygen into the Ti/TiN barrier metal after the lapse of the predetermined exposure time is approximately 80 Å according to the typical method.

Typically, as a thickness of the portion containing oxygen becomes greater, the portion containing oxygen is more easily lost during the cleaning process. Therefore, it is understood from FIG. 3 that the inventive method can reduce the thickness of the portion containing oxygen of the barrier metal to about half of that of the typical method, which results in preventing the pattern collapse. Although the method for patterning the bit line is illustrated in the embodiment, the inventive method can be applied to a method for patterning a metal line using Ti/TiN as a barrier metal.

In accordance with the present invention, the fabrication process can be stably performed because an oxidation of the barrier metal caused by an exposure to an ambient atmosphere is prevented so that the oxidation loss of the barrier metal can be minimized and further the pattern collapse can be effectively prevented.

While the present invention has been described with respect to the specific embodiments, it will be apparent to those skilled in the art that various changes and modifications may be made without departing from the spirit and scope of the invention as defined in the following claims.

What is claimed is:

1. A method for-patterning of patterning a metal line, the method comprising:
    forming a barrier metal layer and a metal layer;
    etching the metal layer;
    etching the barrier metal layer to form a passivation layer on an etched surface of the barrier metal layer; and
    cleaning a resultant structure where the passivation layer is formed, wherein the etching of the barrier metal layer is performed with a temperature of a wafer chuck ranging from approximately 100° C. to approximately 350° C.
    wherein the barrier metal layer includes titanium (Ti)/titanium nitride (TIN);
    wherein the etching of the barrier metal is performed using a mixed gas of fluorine based gas, chlorine based gas and argon gas;
    wherein a total flow rate of the fluorine based gas and the chlorine based gas ranges from approximately 100 sccm to approximately 300 sccm and a flow rate ratio of the fluorine based gas to the chlorine based gas is approximately 1:1;
    wherein a flow rate of the argon gas ranges from approximately 10% to approximately 30% of the total flow rate of the fluorine based gas and the chlorine based gas.

2. The method of claim 1, wherein the fluorine based gas includes at least one gas selected from a group consisting of sulfur hexafluoride (SF6), nitrogen trifluoride (NF3) and tetrafluoromethane (CF4).

3. The method of claim 1, wherein the chlorine based gas includes at least one gas selected from a group consisting of C12 and BC13.

4. The method of claim 1, wherein the metal layer includes tungsten.

5. The method of claim 4, wherein the etching the metal layer is performed using at least one gas selected from a group consisting of $SF_6$, nitrogen ($N_2$), and a combination thereof.

6. The method of claim 1, wherein the temperature of the wafer chuck ranges from 100° C. to 350° C.

\* \* \* \* \*